United States Patent
Hou et al.

(10) Patent No.: US 12,494,434 B2
(45) Date of Patent: Dec. 9, 2025

(54) SEMICONDUCTOR PACKAGES AND METHOD OF MANUFACTURING THE SAME

(71) Applicant: Taiwan Semiconductor Manufacturing Company, Ltd., Hsinchu (TW)

(72) Inventors: Hao-Cheng Hou, Hsinchu (TW); Chien-Hsun Lee, Hsin-chu County (TW); Chung-Shi Liu, Hsinchu (TW); Hung-Jen Lin, Tainan (TW); Jung-Wei Cheng, Hsinchu (TW); Tsung-Ding Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/320,190

(22) Filed: May 13, 2021

(65) Prior Publication Data
US 2022/0367366 A1   Nov. 17, 2022

(51) Int. Cl.
| | |
|---|---|
| H01L 23/31 | (2006.01) |
| H01L 21/768 | (2006.01) |
| H01L 21/78 | (2006.01) |
| H01L 23/00 | (2006.01) |
| H01L 23/538 | (2006.01) |
| H01L 25/065 | (2023.01) |

(52) U.S. Cl.
CPC .... H01L 23/5384 (2013.01); H01L 21/76802 (2013.01); H01L 21/78 (2013.01); H01L 23/31 (2013.01); H01L 23/5386 (2013.01); H01L 24/14 (2013.01); H01L 25/0657 (2013.01)

(58) Field of Classification Search
CPC ............ H01L 23/3121; H01L 23/5226; H01L 23/5384; H01L 23/5386; H01L 24/09; H01L 24/17; H01L 24/33; H01L 24/73
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Trang Q Tran
(74) *Attorney, Agent, or Firm* — JCIPRNET

(57) ABSTRACT

A semiconductor package includes a first integrated circuit, a first conductive via, a second conductive via, a second integrated circuit, a third conductive via and an encapsulant. The first conductive via is disposed in a first passivation layer over the first integrated circuit. The second conductive via is disposed in a second passivation layer over the first passivation layer. The second conductive via is electrically connected to the first conductive via. The third conductive via is disposed over the second integrated circuit, wherein a surface of the third conductive via is substantially coplanar with a surface of the third conductive via. The encapsulant encapsulates the first integrated circuit, the first passivation layer, the second passivation layer, the second integrated circuit and the third conductive via.

20 Claims, 17 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 2007/0045840 A1* | 3/2007 | Varnau | H01L 24/12 |
| | | | 257/772 |
| 2018/0122780 A1* | 5/2018 | Chen | H01L 23/49811 |
| 2019/0131269 A1* | 5/2019 | Lee | H01L 21/486 |
| 2019/0148340 A1* | 5/2019 | Yu | H01L 21/56 |
| | | | 257/737 |
| 2020/0118958 A1* | 4/2020 | Chen | H01L 24/20 |
| 2020/0135677 A1* | 4/2020 | Chang | H01L 23/49894 |
| 2020/0135708 A1* | 4/2020 | Chen | H01L 23/3121 |
| 2020/0235065 A1* | 7/2020 | Chang | H01L 24/16 |
| 2020/0411438 A1* | 12/2020 | Koh | H01L 23/3135 |
| 2022/0013498 A1* | 1/2022 | Kim | H01L 25/0655 |

* cited by examiner

SEMICONDUCTOR PACKAGES AND METHOD OF MANUFACTURING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
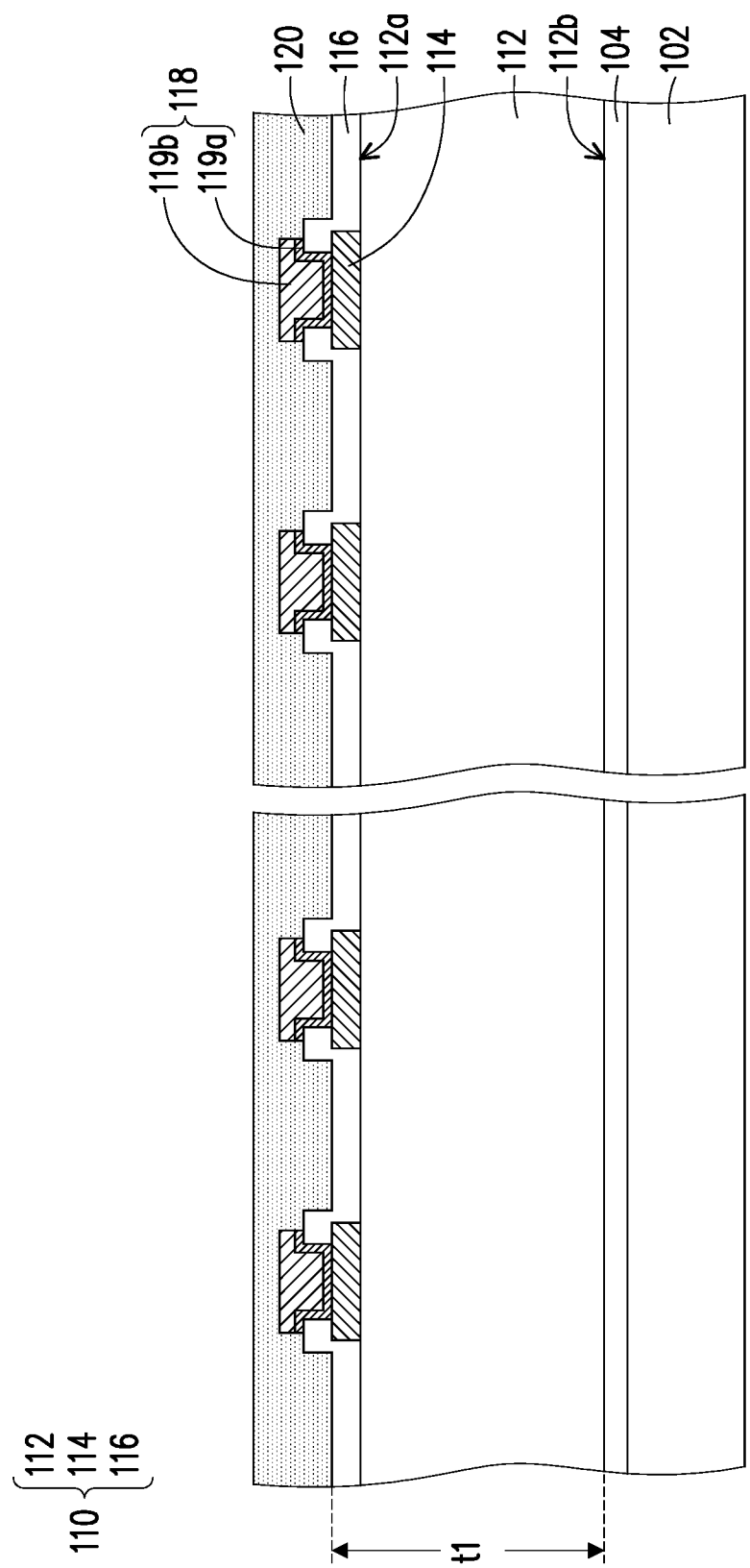
FIG. 1A to FIG. 1I are schematic cross-sectional views of various stages in a method of manufacturing a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross-sectional views of various stages in a method of manufacturing a semiconductor device according to some embodiments.

Referring to FIG. 1A, a semiconductor wafer is provided over a temporary carrier 102. In some embodiments, the semiconductor wafer is illustrated with multiple first integrated circuits 110 formed with and over the semiconductor wafer. The semiconductor wafer may be provided over the temporary carrier 102 through an adhesive layer 104. However, the disclosure is not limited thereto. In some alternative embodiments, the semiconductor wafer is processed directly, and thus the temporary carrier 102 is not required. In some embodiments, the first integrated circuits 110 are logic dies, such as system on chip dies. However, the first integrated circuits 110 may be any other suitable type of logic dies, such as central processing unit (CPU) dies, graphic processing unit (GPU) dies, micro control unit (MCU) dies, input/output dies, baseband (BB) dies, application processor (AP) dies, a combination thereof, or the like. In some alternative embodiments, the first integrated circuits 110 are memory dies, such as high bandwidth memory (HBM) dies, dynamic random access memory (DRAM) dies, a combination thereof, or the like. Additionally, the semiconductor wafer may be received by the manufacturer from a third party manufacturer, or may be manufactured in house.

The first integrated circuit 110 may include a first semiconductor substrate 112, a plurality of first conductive pads 114 and a first protection layer 116. The first semiconductor substrate 112 may include bulk silicon, doped or undoped, or an active layer of a silicon-on-insulator (SOI) substrate. Generally, an SOI substrate include a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The first integrated circuit 110 may include a wide variety of active devices and passive devices such as capacitors, resistors, inductors and the like that may be used to generate the desired structural and functional requirements of the design for the first integrated circuit 110. The active devices and passive devices may be formed using any suitable methods either within or else on the first semiconductor substrate 112. In addition, the first integrated circuit 110 may include interconnection formed using any suitable methods either within or else on the first semiconductor substrate 112.

The first semiconductor substrate 112 has a first surface 112a (e.g., a front surface) and a second surface 112b (e.g., a rear surface) opposite to the first surface 112a. The first surface 112a may be also referred to as an active surface. The first conductive pads 114 are distributed on the first surface 112a of the first semiconductor substrate 112. The first protection layer 116 covers the first surface 112a, and the first conductive pads 114 are partially exposed by the first protection layer 116. In some embodiments, the first conductive pads 114 and the first protection layer 116 are the topmost conductive patterns and the topmost dielectric layer of the interconnection of the first integrated circuit 110. The first conductive pads 114 may be aluminum pads. However, the disclosure is not limited thereto. In some alternative embodiments, the first conductive pads 114 and the first protection layer 116 are bonding pads and bonding layer of the first integrated circuit 110. In some embodiments, the first protection layer 116 is formed of a silicon-containing dielectric material such as silicon oxide, silicon nitride, or the like. The first protection layer 116 may be deposited using any suitable method, such as atomic layer deposition (ALD), chemical vapor deposition (CVD), high-density plasma chemical vapor deposition (HDPCVD), physical vapor deposition (PVD) or the like, to a thickness of between about 1 nm and about 1000 nm, such as about 5 nm. However, any suitable material, process, and thickness may be utilized. In some embodiments, a thickness t1 of the first integrated circuit 110 is substantially equal to a total thickness of the first semiconductor substrate 112, the first protection layer 116 and the first conductive pads 114. In some embodiments, since the thickness of the first protection layer 116 and the thickness of the first conductive pads 114 are much less than the thickness of the first semiconductor substrate 112, the thickness t1 of the first integrated circuit 110 is substantially equal to the thickness of the first semiconductor substrate 112. For example, the thickness t1 of the first integrated circuit 110 is substantially equal to a standard thickness (e.g., 760 μm) of a semiconductor substrate (e.g., a wafer).

Then, a plurality of first conductive vias 118 and a first passivation layer 120 are formed over the first conductive pads 114. The first conductive vias 118 are disposed on and electrically connected to the first conductive pads 114, and the first passivation layer 120 covers the first conductive vias 118 and the first protection layer 116. In some embodiments, the first passivation layer 120 covers top surfaces of the first conductive vias 118. The first conductive vias 118 may have different or the same thickness (i.e., height) ranging from about 10 μm to about 35 μm measuring from the first surface 112a to its own top surface. In some embodiments, the first conductive via 118 includes a seed layer 119a and a metal layer 119b, and the seed layer 119a is disposed on a bottom of the metal layer 119b. Materials of the seed layer 119a and the metal layer 119b may include copper, copper alloys, or other suitable choice of materials. In some embodiments, a material of the first passivation layer 120 includes polybenzoxazole, polyimide, a suitable organic or inorganic material, or the like. In some embodiments, a thickness of the first passivation layer 120 is in a range of 10 μm to about 40 μm. In some embodiments, the first conductive via 118 is also referred to as via 0.

Figure 1B:
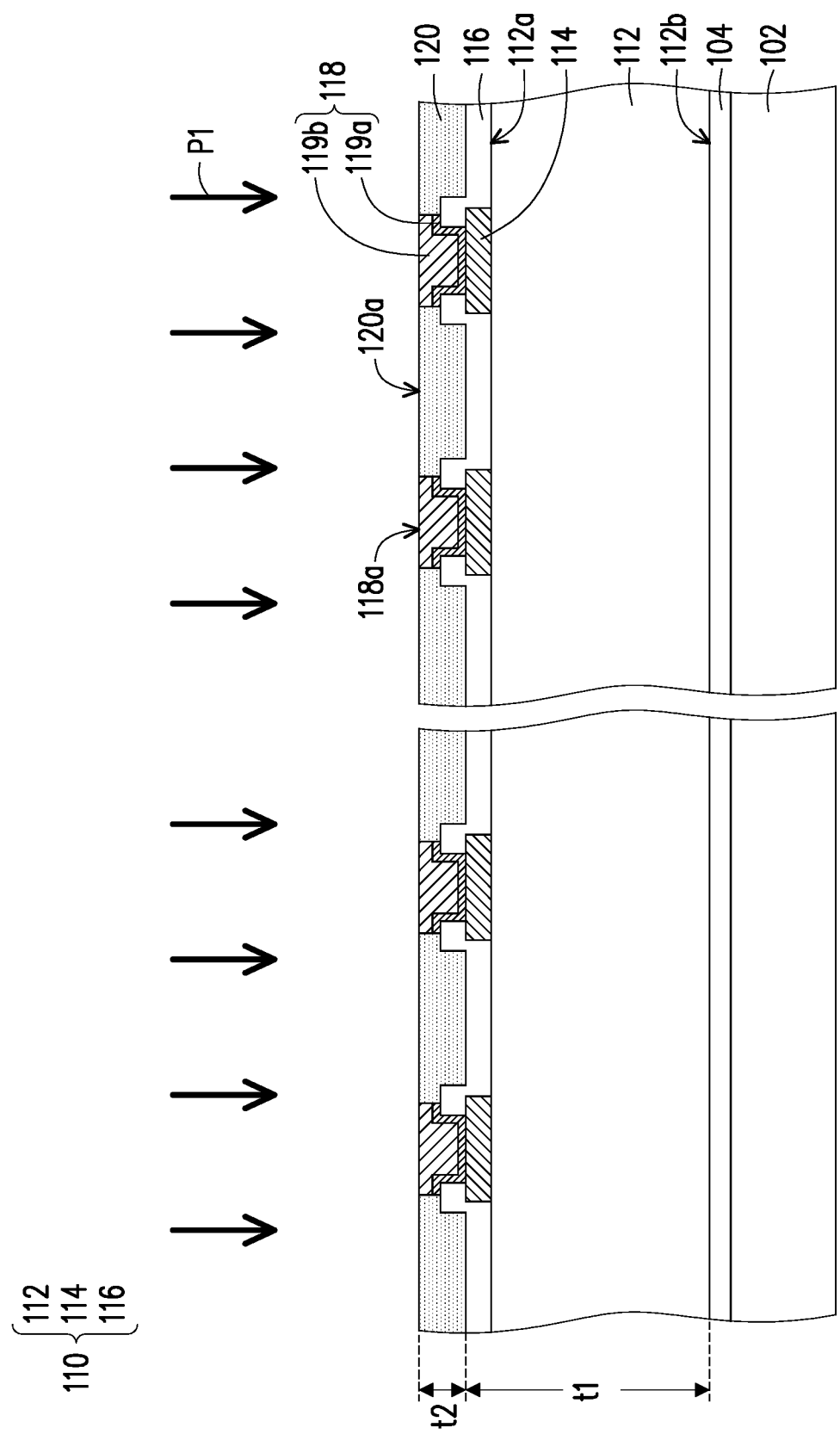

Referring to FIG. 1B, a first planarization process P1 is performed on a surface of the first passivation layer 120, to expose top surfaces 118a of the first conductive vias 118.

The first planarization process P1 may be a grinding process such as a chemical mechanical polishing (CMP) process or any suitable planarization process. In some embodiments, a portion of the first passivation layer 120 is removed while the first conductive vias 118 remain intact without being removed. However, the disclosure is not limited thereto. In some alternative embodiments, the first conductive vias 118 are partially removed by the first planarization process P1. In some embodiments, after performing the first planarization process P1, a top surface 120a of the first passivation layer 120 is substantially coplanar with the top surfaces 118a of the first conductive vias 118, and the top surfaces 118a of the first conductive vias 118 are revealed. The first conductive vias 118 have substantially the same thickness. In some embodiments, the first conductive vias 118 and the first passivation layer 120 have a thickness t2 less than 35 μm. For example, the thickness t2 is in a range of 5 μm to about 30 μm.

Figure 1C:
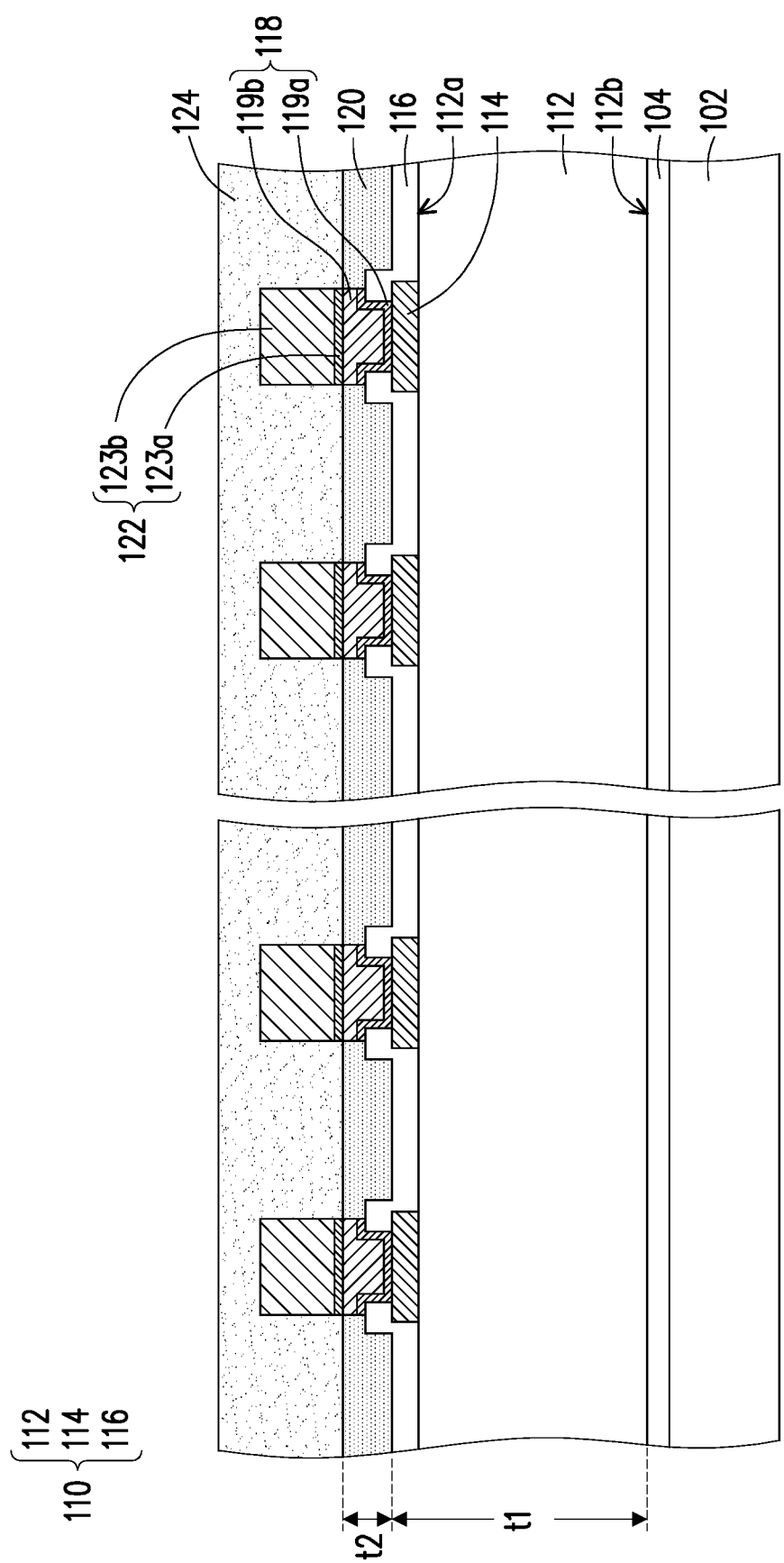

Referring to FIG. 1C, a plurality of second conductive vias 122 and a second passivation layer 124 are formed over the first conductive vias 118 and the first passivation layer 120. The second conductive vias 122 are disposed on the first conductive vias 118 and are covered by the second passivation layer 124. In some embodiments, the second passivation layer 124 covers top surfaces of the second conductive vias 122. In some embodiments, a thickness (i.e., height) of the second conductive vias 122 is larger than the thickness of the first conductive vias 118. The second conductive vias 122 may have different or the same thickness ranging from about 35 μm to about 100 μm. However, the disclosure is not limited thereto. In some alternative embodiments, the thickness of the second conductive vias 122 is the same as or smaller than the thickness of the first conductive vias 118. The second conductive vias 122 at least overlay with the first conductive vias 118 to electrically connect the first conductive vias 118. A width of the second conductive vias 122 may be substantially the same as a width of the first conductive vias 118. Sidewalls of the second conductive via 122 may be substantially flush with sidewalls of the first conductive via 118. However, the disclosure is not limited thereto. The second conductive vias 122 may have different width from the first conductive vias 118.

In some embodiments, the second conductive via 122 includes a seed layer 123a and a metal layer 123b, and the seed layer 123a is disposed on a bottom of the metal layer 123b. In some embodiments, the seed layer 123a is disposed between and in direct contact with the metal layer 123b and the metal layer 119b. For example, sidewalls of the seed layer 123a and the metal layer 123b are substantially flush with sidewalls of the seed layer 119a and the metal layer 119b. Materials of the seed layer 123a may include Ta, Ti, Cu, Ni, or other suitable choice of materials, and the metal layer 123b may include Cu, Cu alloy, Ni or other suitable choice of materials. In some embodiments, a material of the second passivation layer 124 is different from a material of the first passivation layer 120. The second passivation layer 124 includes a material which may provide a sufficient thickness. The second passivation layer 124 may include a molding compound having at least one type of filler-containing resins, a polymer such as polybenzoxazole or polyimide, a suitable organic or inorganic material, or the like. The resins are epoxy resins, phenolic resins or silicon-containing resins. The fillers may be made of non-melting inorganic materials and the fillers include metal oxide particles, silica particles or silicate particles with the average particle size not larger than 10 μm. For example, the average particle size of the fillers ranges from about 3 μm to about 20 μm. In some alternative embodiments, the second passivation layer 124 includes no fillers. In some embodiments, the thickness of the second passivation layer 124 is in a range of 50 μm to about 150 μm.

Figure 1D:
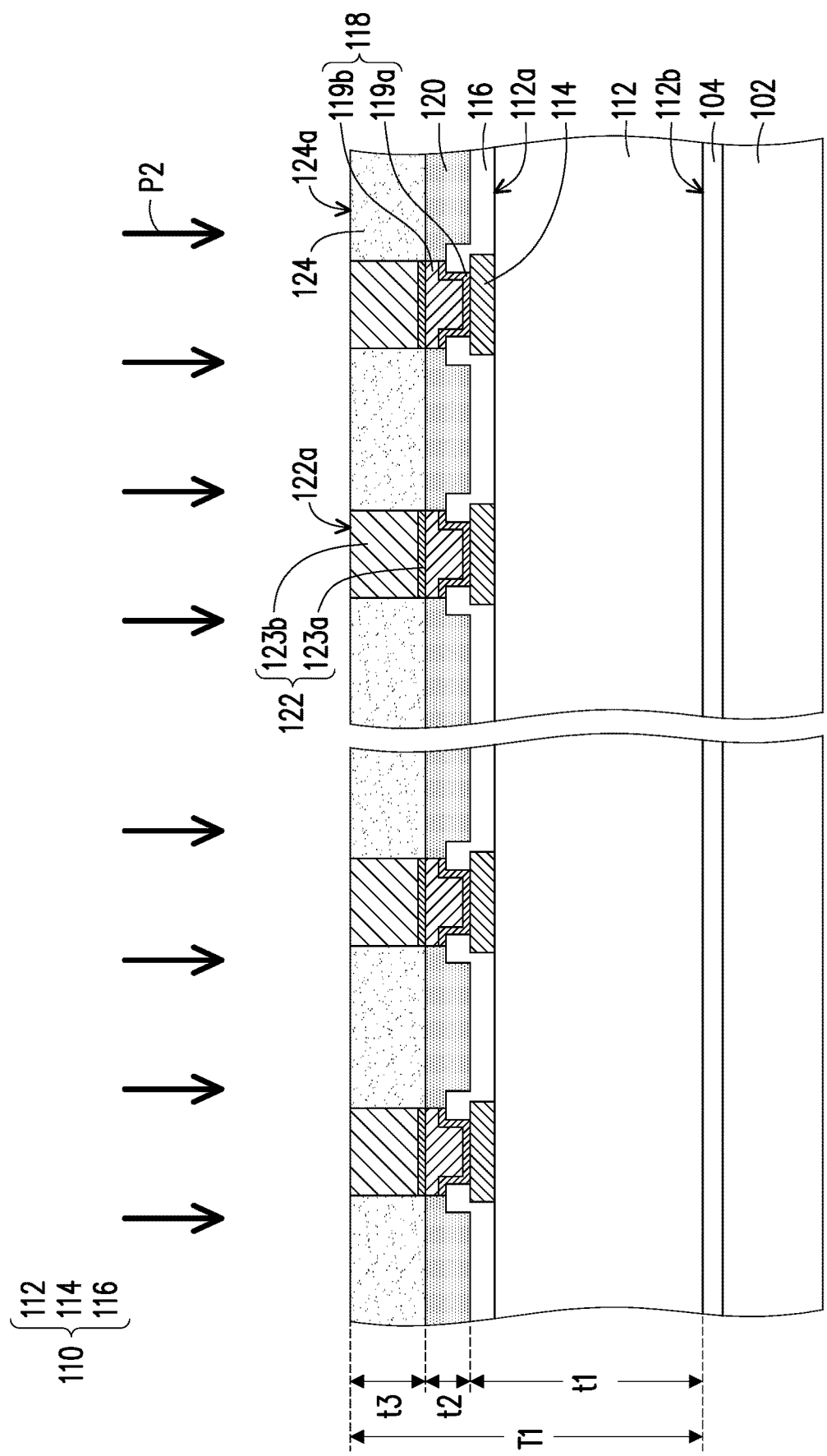

Referring to FIG. 1D, a second planarization process P2 is performed on a surface of the second passivation layer 124, to expose top surfaces 122a of the second conductive vias 122. The second planarization process P2 may be a grinding process such as a chemical mechanical polishing (CMP) process or any suitable planarization process. In some embodiments, a portion of the second passivation layer 124 is removed while the second conductive vias 122 remain intact without being removed. However, the disclosure is not limited thereto. In some alternative embodiments, the second conductive vias 122 are partially removed by the second planarization process P2. In some embodiments, after performing the second planarization process P2, a top surface 124a of the second passivation layer 124 is substantially coplanar with the top surfaces 122a of the second conductive vias 122, and the top surfaces 122a of the second conductive vias 122 are revealed. The second conductive vias 122 have substantially the same thickness. In some embodiments, a thickness t3 of the second conductive vias 122 and the second passivation layer 124 is larger than the thickness t2 of the first conductive vias 118 and the first passivation layer 120. In some embodiments, the thickness t3 not less than 35 μm. For example, the thickness t3 is in a range of 35 μm to about 100 μm. However, the disclosure is not limited thereto. In some alternative embodiments, the thickness t3 of the second conductive vias 122 and the second passivation layer 124 is the same as or smaller than the thickness t2 of the first conductive vias 118 and the first passivation layer 120.

Figure 1E:
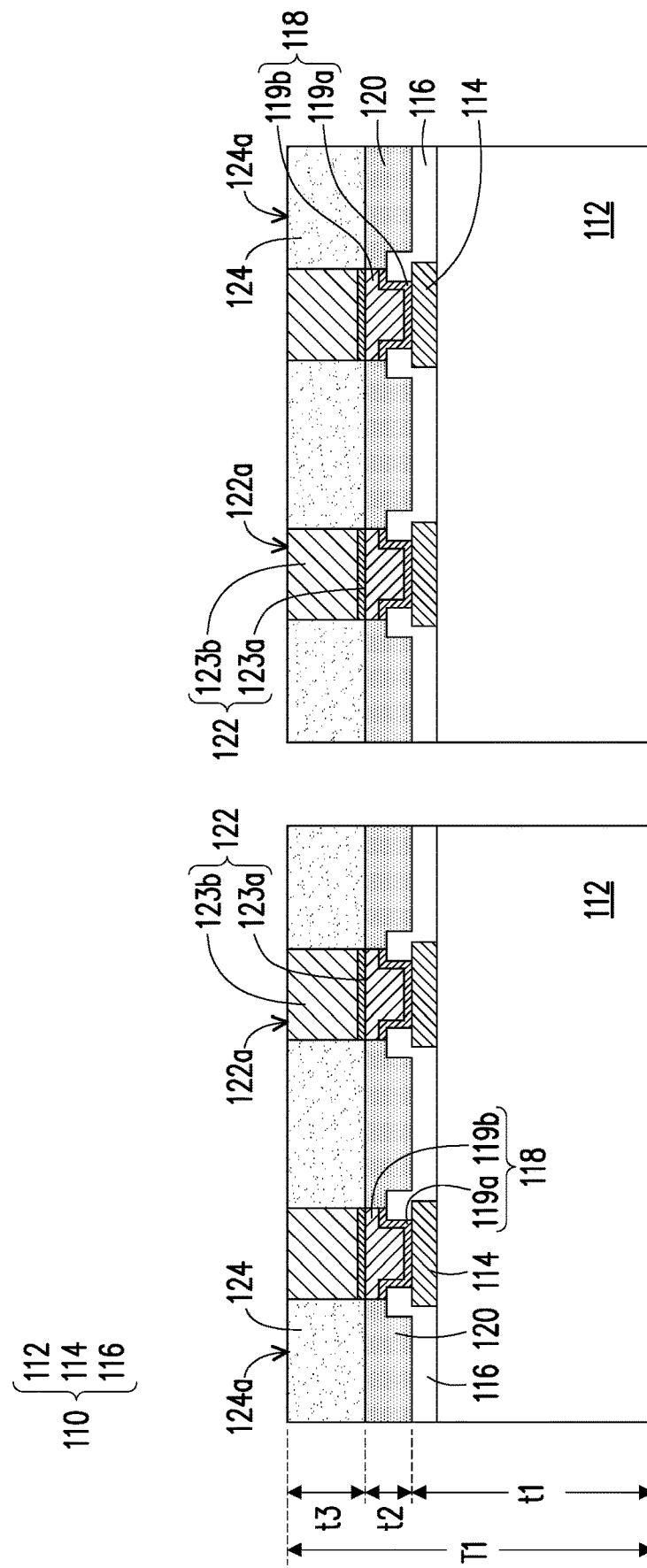

Referring to FIG. 1E, a dicing or singulation process is performed to separate the first integrated circuits 110 from each other. In some embodiments, the first integrated circuits 110 are de-bonded from the temporary carrier 102. In some embodiments, a scribe region (not shown) is located between two adjacent first integrated circuits 110, and the dicing or singulation process is performed along the scribe regions. In some embodiments, the first passivation layer 120 and the second passivation layer 124 over the scribe region are cut off during the die singulation process. A cutting machine used for separating the first integrated circuits 110 along the scribe regions typically involves dicing with a rotating blade or a laser beam. In other words, the dicing or singulation process is, for example, a laser cutting process or a mechanical cutting process. In some embodiments, sidewalls of the first passivation layer 120 are substantially flush with sidewalls of the second passivation layer 124.

Figure 1F:
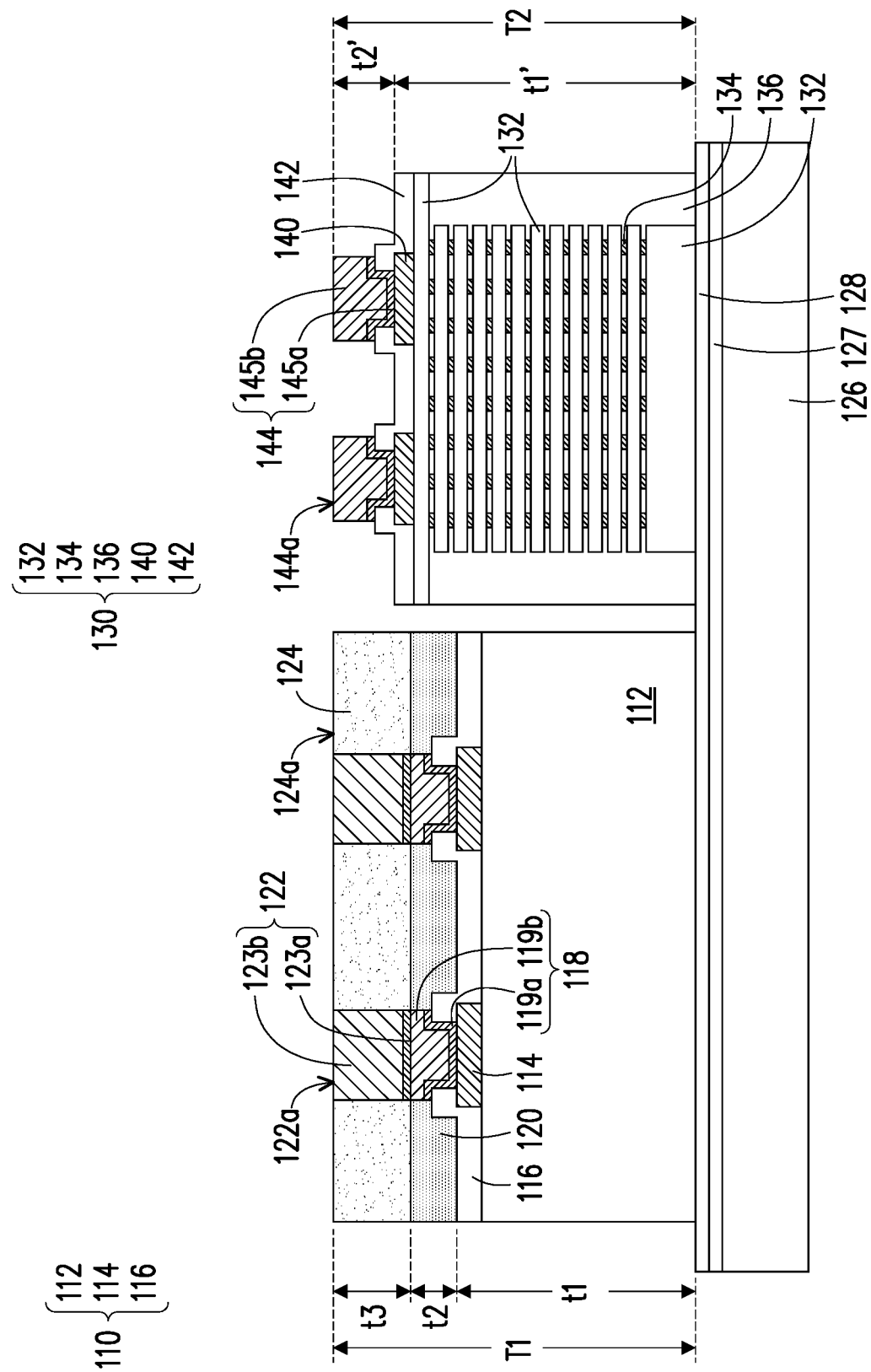

After the dicing or singulation process is performed, as an example illustrated in FIG. 1F, at least one first integrated circuit 110 and at least one second integrated circuit 130 are disposed on a temporary carrier 126. For example, the first integrated circuit 110 and the second integrated circuit 130 are picked and placed on the temporary carrier 126. The temporary carrier 126 may be a glass carrier, a ceramic carrier, a metal carrier, or the like. In some embodiments, the first integrated circuit 110 and the second integrated circuit 130 are attached onto the temporary carrier 126 through an adhesive layer 128. The adhesive layer 128 may be a die attach film (DAF) or other suitable adhesive material. In some embodiments, a de-bonding layer 127 is further formed between the temporary carrier 126 and the adhesive layer 128. In some embodiments, the de-bonding layer 127 is formed of an adhesive such as Ultra-Violet (UV) glue, Light-to-Heat Conversion (LTHC) glue, or other types of adhesives. In some embodiments, the de-bonding layer 127 is decomposable under the heat of light to release the temporary carrier 126 from the overlying structures that will be formed in subsequent steps. In some alternative embodiments, a buffer layer (not shown) may be formed between the de-bonding layer 127 and the temporary carrier 126. The buffer layer may include a dielectric material layer made of a dielectric material including benzocyclobutene ("BCB"), polybenzooxazole ("PBO"), or any other suitable polymer-based dielectric material.

The first integrated circuit 110 and the second integrated circuit 130 may be the same types of dies or different types of dies. In some embodiments, the second integrated circuit 130 is a memory die, such as a dynamic random access memory (DRAM) die, a high bandwidth memory (HBM) die, a die stack, a combinations of these, or the like. However, the disclosure is not limited thereto. In some alternative embodiments, the second integrated circuit 130 are logic dies, such as system on chip dies, central processing unit (CPU) dies, graphic processing unit (GPU) dies, micro control unit (MCU) dies, input/output dies, baseband (BB) dies, application processor (AP) dies, a combination thereof, or the like. In an embodiment, the first integrated circuit 110 is a SoC die, and the second integrated circuit 130 is a die stack such as an HBM die. For example, the second integrated circuit 130 includes a plurality of dies 132 stacking on one another and an encapsulant 136 encapsulating the dies 132. The dies 132 may be electrically connected to one another through a plurality of bumps 134 therebetween, and the encapsulant 136 may be disposed between the bumps 134. In some embodiments, the outermost die 132 of the dies 132 has a larger width than other dies 132, and the outermost die 132 is also referred to as a base die. Additionally, the second integrated circuit 130 may be received by the manufacturer from a third party manufacturer, or may be manufactured in house.

The second integrated circuit 130 includes at least one die 132, a plurality of second conductive pads 140 and a second protection layer 142. The second conductive pads 140 are distributed on the topmost die 132. The second conductive pads 140 are partially exposed by the second protection layer 142. In some embodiments, the second conductive pads 140 and the second protection layer 142 are the topmost conductive patterns and the topmost dielectric layer of the second integrated circuit 130. The second conductive pads 140 and the second protection layer 142 may be the topmost conductive patterns and the topmost dielectric layer of the topmost die 132. In some embodiments, the second conductive pads 140 and the second protection layer 142 are bonding pads and bonding layer of the second integrated circuit 130. In some embodiments, the second protection layer 142 is formed of a silicon-containing dielectric material such as silicon oxide, silicon nitride, or the like. The second protection layer 142 may be deposited using any suitable method, such as ALD, CVD, HDPCVD, PVD or the like, to a thickness of between about 1 nm and about 1000 nm, such as about 5 nm. However, any suitable material, process, and thickness may be utilized. A plurality of conductive vias 144 are formed over the second conductive pads 140. The conductive vias 144 are disposed on and electrically connected to the second conductive pads 140. The conductive vias 144 may have a thickness t2' ranging from about 10 μm to about 40 μm. In some embodiments, the conductive vias 144 includes a seed layer 145a and a metal layer 145b, and the seed layer 145a is disposed on a bottom of the metal layer 145b. Materials of the seed layer 145a may include Ta, Ti, Cu, Ni, or other suitable choice of materials, and the metal layer 145b may include Cu, Cu alloy, Ni or other suitable choice of materials.

The second integrated circuit 130 has a thickness t1' larger than the thickness t1 of the first integrated circuit 110. In some embodiments, the thickness t1' of the second integrated circuit 130 is substantially equal to a total thickness of the dies 132 and the bumps 134 therebetween and the second conductive pads 140. In some embodiments, since the thickness of the second conductive pads 140 is much less than a total thickness of semiconductor substrates of the dies 132, the thickness t1' of the second integrated circuit 130 is substantially equal to the total thickness of semiconductor substrates of the dies 132. In some embodiments, the thickness t1' of the second integrated circuit 130 is larger than a standard thickness (e.g., 760 μm) of a semiconductor substrate (e.g., a wafer). In some embodiments, the second integrated circuit 130 is also referred to an ultra-height die. In other words, the first integrated circuit 110 and the second integrated circuit 130 have different thickness t1, t1', and a thickness difference is formed between the first integrated circuit 110 and the second integrated circuit 130. However, in some embodiments, a total thickness T1 of the first integrated circuit 110 (i.e., the thickness t1) and the first conductive via 118 (i.e., the thickness t2) and the second conductive via 122 (i.e., the thickness t3) thereon is substantially equal to a total thickness T2 of the second integrated circuit 130 (i.e., the thickness t1') and the conductive via 144 (i.e., the thickness t2') thereon. Since the thickness of the first protection layer 116 may be substantially the same as the thickness of the second protection layer 142 or the thickness of the first protection layer 116 and the thickness of the second protection layer 142 may be neglected, the top surface 122a of the second conductive via 122 and the top surface 124a of the second passivation layer 124 are substantially coplanar with a top surface 144a of the conductive via 144. The coplanarity between the first integrated circuit 110 and the second integrated circuit 130 is beneficial to the sequential process to perform. It is noted that in some embodiments, only two conductive vias (i.e., the first conductive via 118 and the second conductive via 122) are illustrated as stacking over the first integrated circuit 110, however, in order to obtained a desired thickness, more than two conductive vias may be stacked over the first integrated circuit 110. In addition, if required, more than one conductive via may be stacked over the second integrated circuit 130.

Figure 1G:
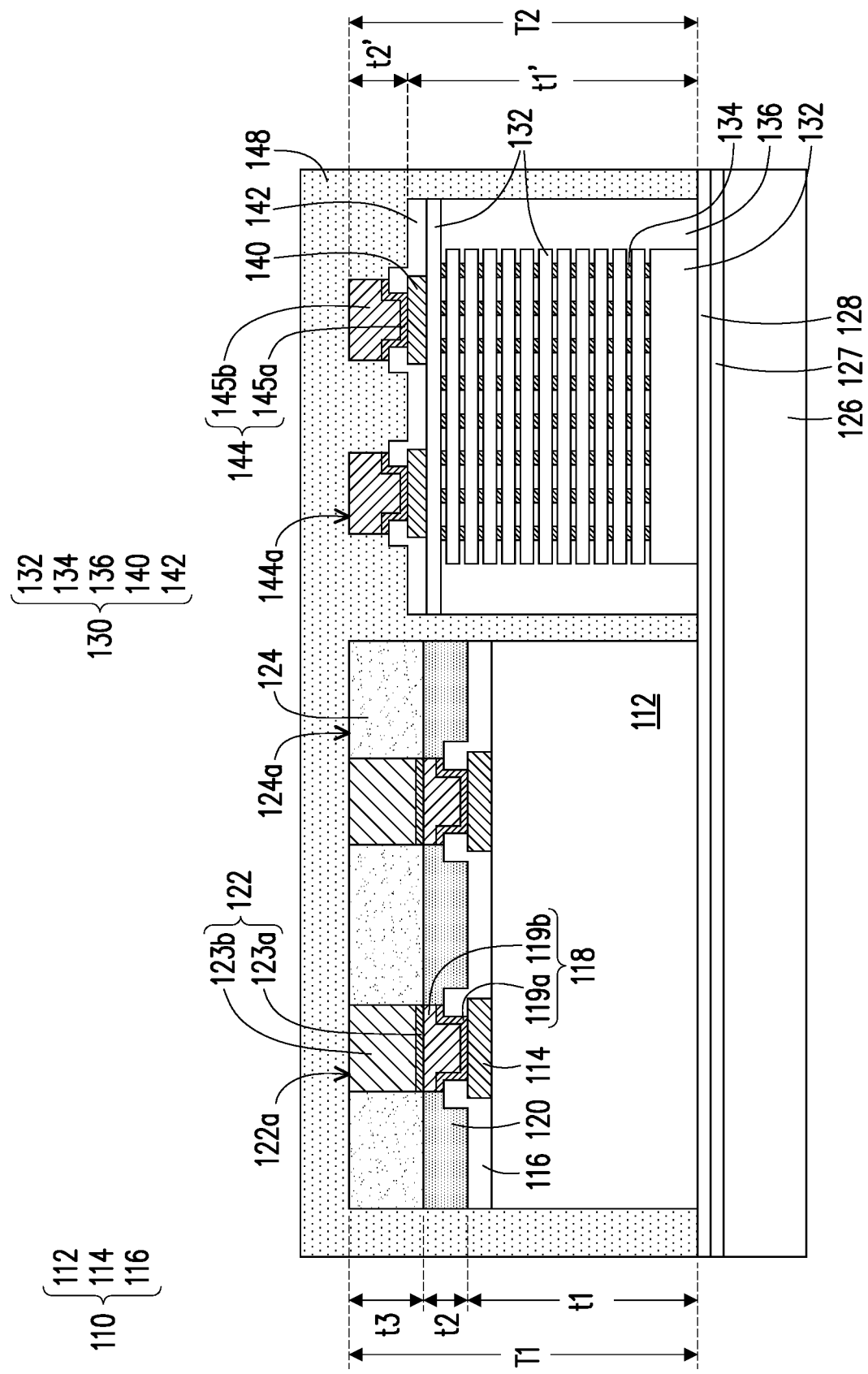

Referring to FIG. 1G, an insulating material 148 is formed over the temporary carrier 126, so that the first integrated circuit 110 and the second integrated circuit 130 are overmolded. In some embodiments, the top surfaces 122a, 124a, 144a of the second conductive vias 122 and the second passivation layer 124 of the first integrated circuit 110 and the conductive vias 144 of the second integrated circuit 130 are covered by the insulating material 148. The insulating material 148 includes a molding compound, a dielectric material such as polybenzoxazole, polyimide, benzocyclobutene, a combination thereof, or other suitable electrically insulating materials. In some embodiments, the insulating material 148 includes the molding compound having at least one type of filler-containing resins. The resins are epoxy resins, phenolic resins or silicon-containing resins. The fillers may be made of non-melting inorganic materials and the fillers include metal oxide particles, silica particles or silicate particles with the average particle size ranging from about 3 μm to about 20 μm, from about 10 μm to about 20 μm or ranging from about 15 μm to about 20 μm. In some embodiments, the average particle size of the fillers in the second passivation layer 124 is smaller than the average particle size of the fillers in the insulating material 148. In some alternative embodiments, the insulating material 148 includes no fillers.

Figure 1H:
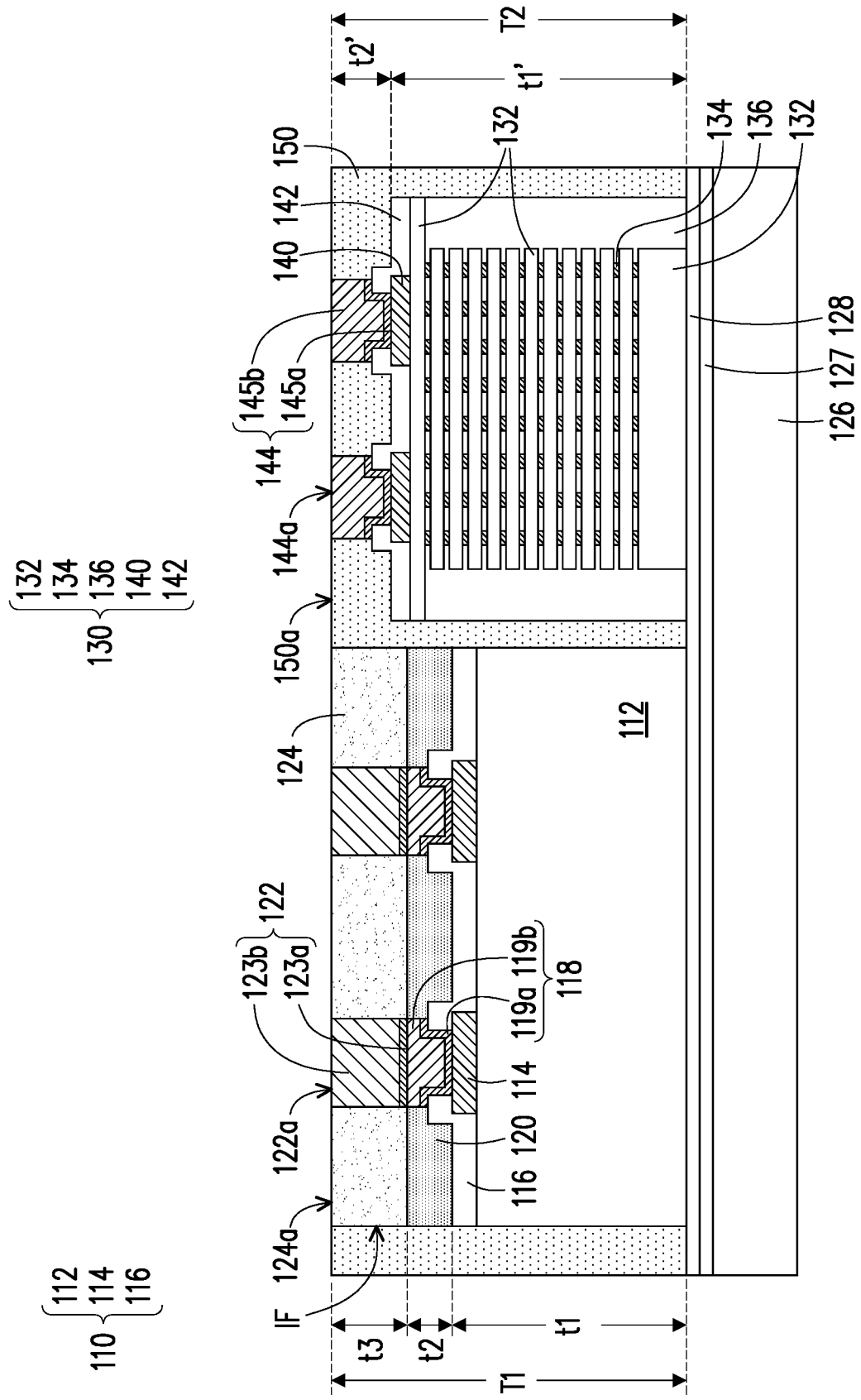

Referring to FIG. 1H, the insulating material 148 is partially removed, to form an encapsulant 150. The encapsulant 150 encapsulates the first integrated circuit 110 and the second integrated circuit 130. In some embodiments, a thinning process is performed on the insulating material 148 to reduce the thickness of the insulating material 148 until the second conductive vias 122 and the second passivation layer 124 of the first integrated circuit 110 and the conductive vias 144 of the second integrated circuit 130 are accessibly revealed. The thinning process may include a planarization process, a chemical mechanical polishing (CMP) process, and/or a planarization process, or other suitable removing process. A cleaning step is optionally performed after thinning to clean and remove the residues generated from the thinning process. After reducing the thickness of the insulating material 148, the encapsulant 150 is formed. However, the formation of the encapsulant 150 may be performed through any other suitable techniques, the disclosure is not limited thereto. In some alternative embodiments, during the thinning process, the second conductive vias 122, the second passivation layer 124 and/or the conductive vias 144 may be slightly removed and planarized. After the thinning process, the second conductive vias 122 of the first integrated circuit 110 and the conductive vias 144 of the second integrated circuit 130 may be accessibly revealed by the encapsulant 150. The second conductive vias 122, the second passivation layer 124 and/or the conductive vias 144 may have planarized surfaces. In some embodiments, a top surface 150a of the encapsulant 150 is substantially coplanar with the top surfaces 122a, 124a, 144a of the second conductive via 122, the second passivation layer 124 and the conductive via 144. The material of the second passivation layer 124 may be different from or the same as the material of the encapsulant 150, however, an interface IF may be formed between the second passivation layer 124 and the encapsulant 150 since they are formed separately. In some embodiments, the encapsulant 150 laterally cover the conductive vias 144 and in direct contact with the conductive vias 144. However, the disclosure is not limited thereto. In some alternative embodiments, the second integrated circuit 130 further includes a passivation layer laterally covering the conductive vias 144, and thus the encapsulant 150 encapsulates the passivation layer without being in contact with the conductive vias 144.

Figure 1I:
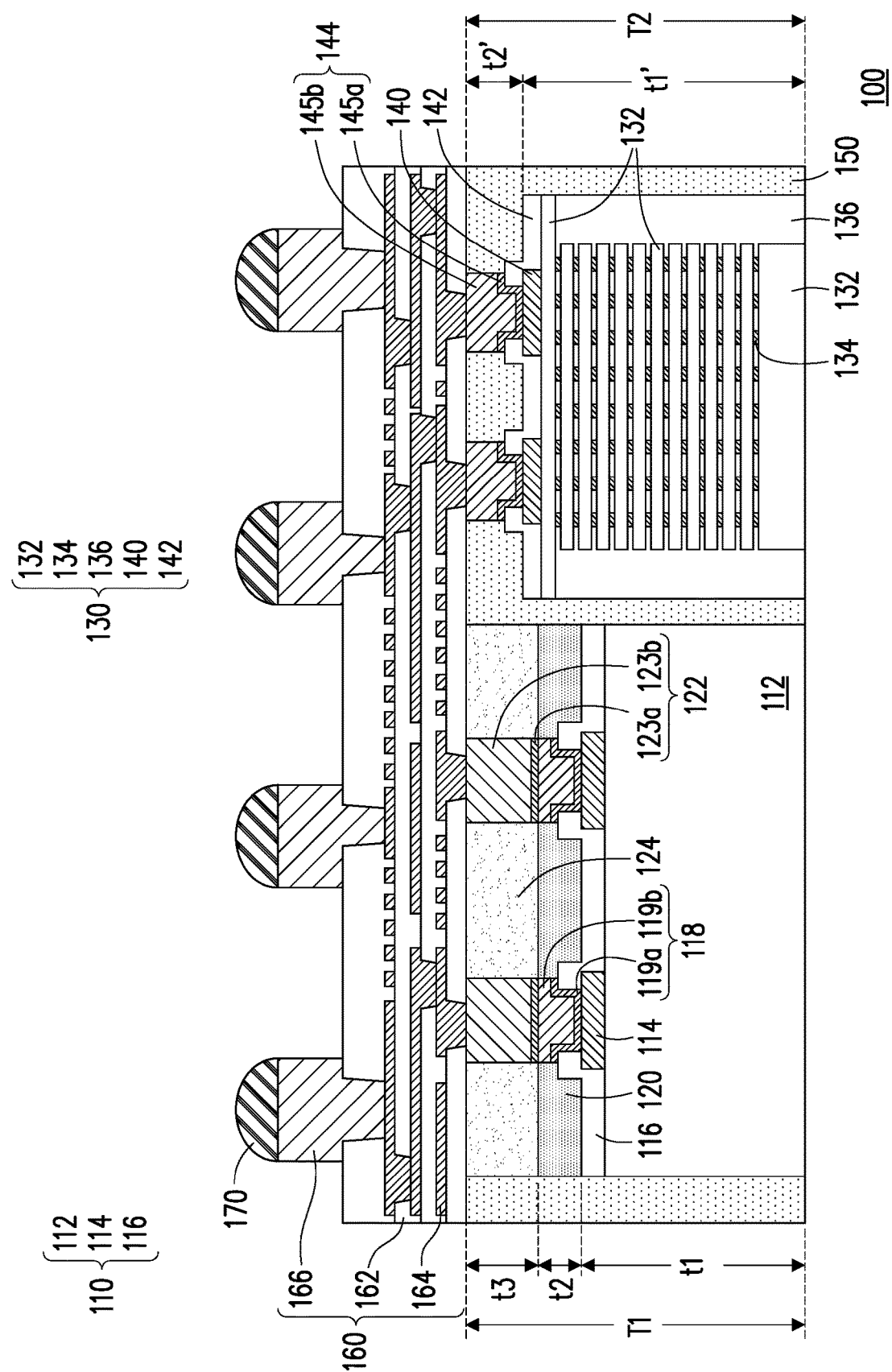

Referring to FIG. 1I, a redistribution layer 160 is formed on the top surface 150a of the encapsulant 150, to electrically connect to the first integrated circuit 110 and the second integrated circuit 130. As shown in FIG. 1G, the redistribution layer 160 includes a plurality of dielectric layers 162 and a plurality of redistribution conductive patterns 164, 166 in the dielectric layers 162. The redistribution conductive patterns 164, 166 are electrically connected to the second conductive vias 122 of the first integrated circuit 110 and the conductive vias 144 of the second integrated circuit 130 for electrical connection. The redistribution conductive patterns 164, 166 may include tungsten, copper, a copper alloy, aluminum, an aluminum alloy or a combination thereof. In some alternative embodiments, the redistribution conductive patterns 164 include a seed layer (not shown) and a conductive layer (not shown), and the seed layer is disposed on a bottom of the conductive layer. In some embodiments, the topmost redistribution conductive patterns 166 are underbump metallization layers.

Then, a plurality of bumps 170 may be placed on the redistribution layer 160, to form a semiconductor package 100. The bumps 170 are electrically connected to the redistribution conductive pattern 164, 166. The bumps 170 may be a ball grid array (BGA) which includes a eutectic material such as solder, although any suitable materials may be used. In an embodiment in which the bumps 170 are solder bumps, the bumps 170 are formed using a ball drop method, such as a direct ball drop process. In another embodiment, the solder bumps are formed by initially forming a layer of tin through any suitable method such as evaporation, electroplating, printing, solder transfer, and then performing a reflow in order to shape the material into the desired bump shape.

After that, as shown in FIG. 1I, the semiconductor package 100 is de-bonded from the temporary carrier 126. That is, the temporary carrier 126, the de-bonding layer 127 and the adhesive layer 128 are removed. In some embodiments, the de-bonding layer 127 (e.g., the LTHC release layer) is irradiated by an UV laser. The semiconductor package 100 may be connected and/or stacked with other electronic devices. In some embodiments, the semiconductor package 100 is an integrated fan-out (InFO) package. In some embodiments, the InFO package (also referred to as an InFO module) further joints with a substrate in a flip-chip manner to form a package unit, which includes the InFO package, the substrate, joints such as C4 (controlled collapse chip connection) joints, an underfill between aside the joints between the InFO package and the substrate.

In some embodiments, the first integrated circuit (i.e., the first integrated circuit 110) has multiple passivation layers (e.g., the first passivation layer 120 and the second passivation layer 124) thereon, and thus a total thickness of the first integrated circuit and the passivation layers is designed. For example, by controlling a thickness of the topmost passivation layer (e.g., the second passivation layer 124), the total thickness of the first integrated circuit and the passivation layers (also the total thickness of the first integrated circuit and the conductive vias layers) is substantially equal to a total thickness the second integrated circuit and the conductive via thereon. Accordingly, when the first integrated circuit is integrated with the second integrated circuit (e.g., the ultra-thick integrated circuit and/or the integrated circuit from a third party manufacturer), the facing-up surfaces of the first integrated circuit and the second integrated circuit are substantially coplanar during the packaging process.

Figure 2A:
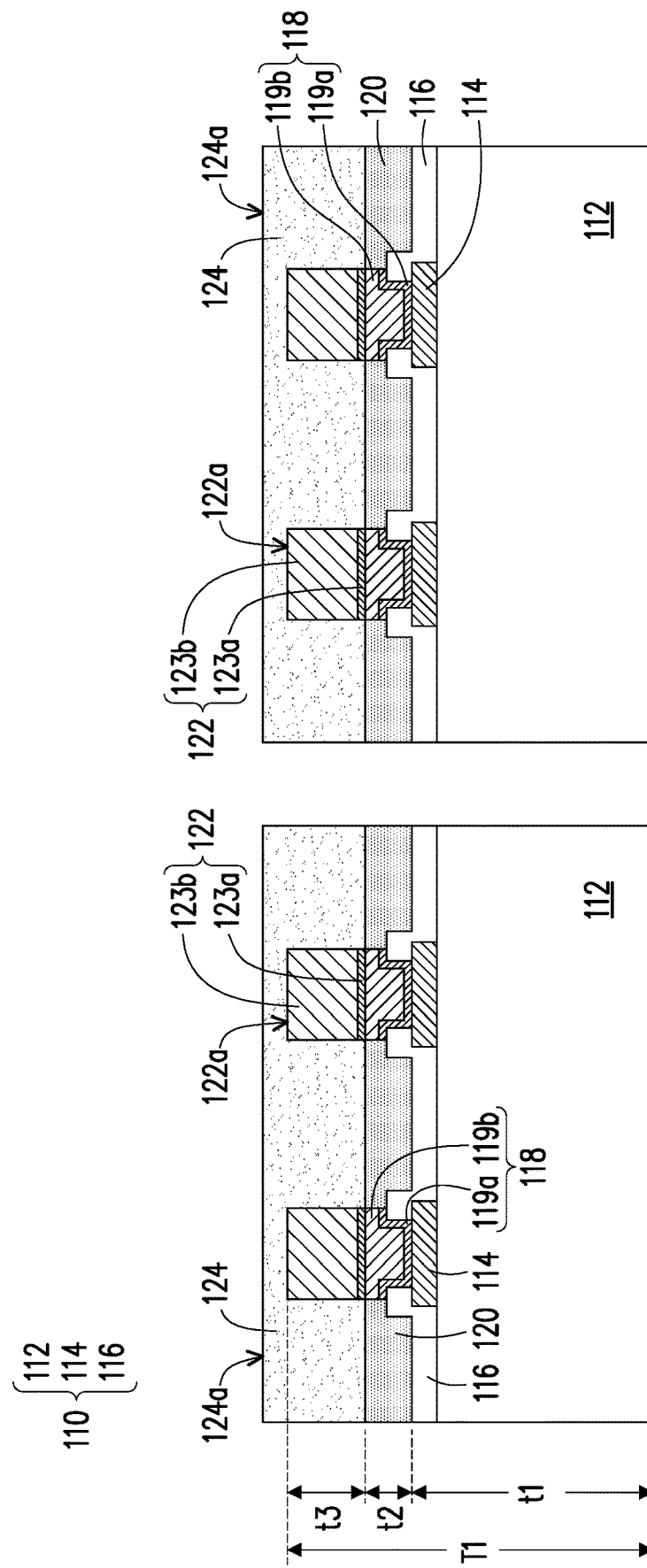
FIG. 2A to FIG. 2C are schematic cross-sectional views of various stages in a method of manufacturing a semiconductor device according to some embodiments.
Figure 2B:
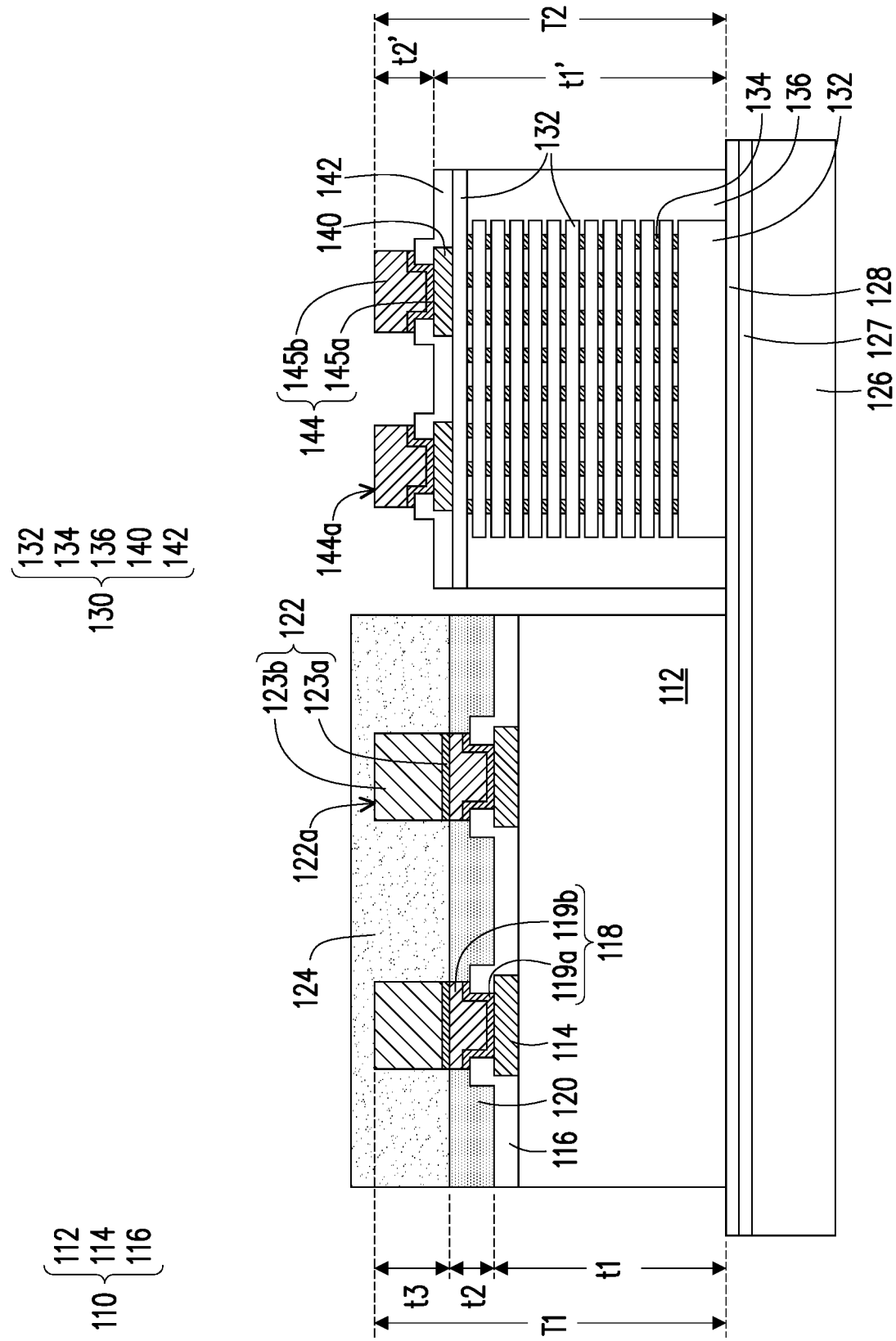
Figure 2C:
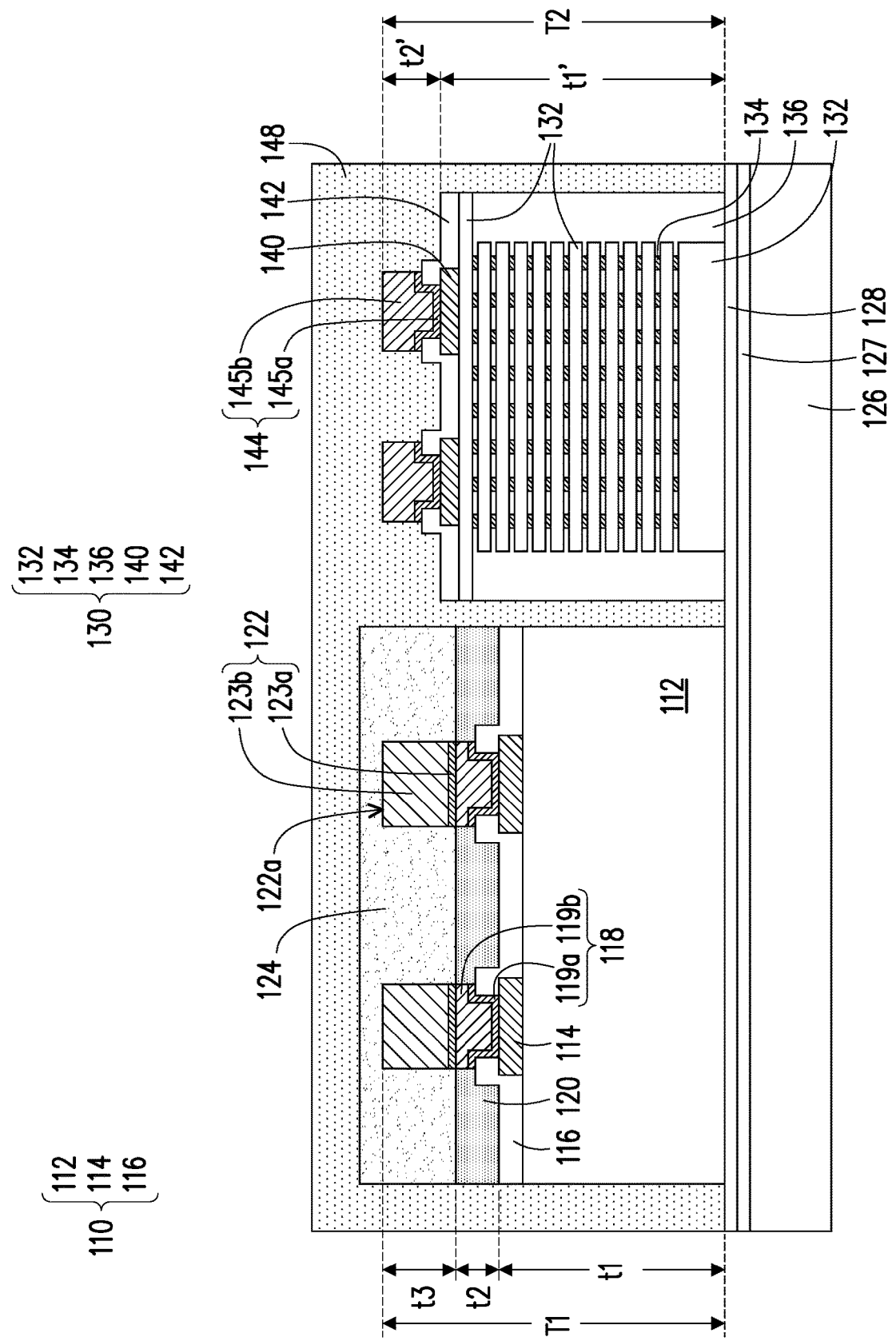

In the above embodiments, the second planarization process P2 is performed before the dicing or singulation process. However, the disclosure is not limited thereto. In some alternative embodiments, the second planarization process P2 is omitted. FIG. 2A to FIG. 2C are schematic cross-sectional views of various stages in a method of manufacturing a semiconductor device according to some embodiments. The steps of FIG. 2A to FIG. 2C may replace the steps of FIG. 1D to FIG. 1G, in other words, the step of FIG. 2A is continuously performed after the step of FIG. 1C and the step of FIG. 1H is continuously performed after the step of FIG. 2C. The elements similar to or substantially the same as the elements described previously will use the same reference numbers, and certain details or descriptions of the same elements may not be repeated herein. Referring to FIG. 2A, a dicing or singulation process is performed on the structure of FIG. 1C to separate the first integrated circuits 110 from each other. Thus, as shown in FIG. 2A, top surfaces 122a of the second conductive vias 122 of the first integrated circuits 110 may be covered and protected by the second passivation layer 124 without being exposed. In other words, a top surface 124a of the second passivation layer 124 is higher than the top surfaces 122a of the second conductive vias 122.

Referring to FIG. 2B, at least one first integrated circuit 110 and at least one second integrated circuit 130 are disposed on a temporary carrier 126 through an adhesive layer 128. In some embodiments, a de-bonding layer 127 is further formed between the temporary carrier 126 and the adhesive layer 128. The step of FIG. 2B may be similar to the step of FIG. 1F, and thus the details thereof are omitted. In some embodiments, the second conductive vias 122 of the first integrated circuit 110 are entirely covered and protected by the second passivation layer 124 without being exposed.

Referring to FIG. 2C, an insulating material 148 is formed on the temporary carrier 126, so that the first integrated circuit 110 and the second integrated circuit 130 are overmolded. In some embodiments, top surfaces of the second passivation layer 124 of the first integrated circuit 110 and the conductive vias 144 of the second integrated circuit 130 are covered by the insulating material 148. The second conductive vias 122 is covered by the second passivation layer 124 without being in contact with the insulating material 148. The materials and forming method of the insulating material 148 are similar to those described above, and thus details are omitted.

Then, as shown in FIG. 1H the insulating material 148 is partially removed by a thinning process, to form an encapsulant 150. The thinning process for the insulating material 148 is similar to the thinning process described above. The main difference lies in the second passivation layer 124 of the first integrated circuit 110 is simultaneously removed by the thinning process to expose the second conductive vias 122. After that, a redistribution layer 160 and a plurality of bumps 170 are sequentially formed over the encapsulant 150, to form a semiconductor package 100 as shown in FIG. 1I.

In some embodiments, the second conductive vias 122 of the first integrated circuit 110 are covered by the second passivation layer 124 before packaging with the second integrated circuit 130. In other words, the second conductive vias 122 are protected by the second passivation layer 124 without being exposed during placement process onto the temporary carrier 126, and thus the damage to the second conductive vias 122 may be prevented. Thus, the performance of the first integrated circuit 110 may be improved. In addition, the second grinding process may be omitted, and thus the cost and the time of manufacturing the semiconductor package may be reduced.

Figure 3:
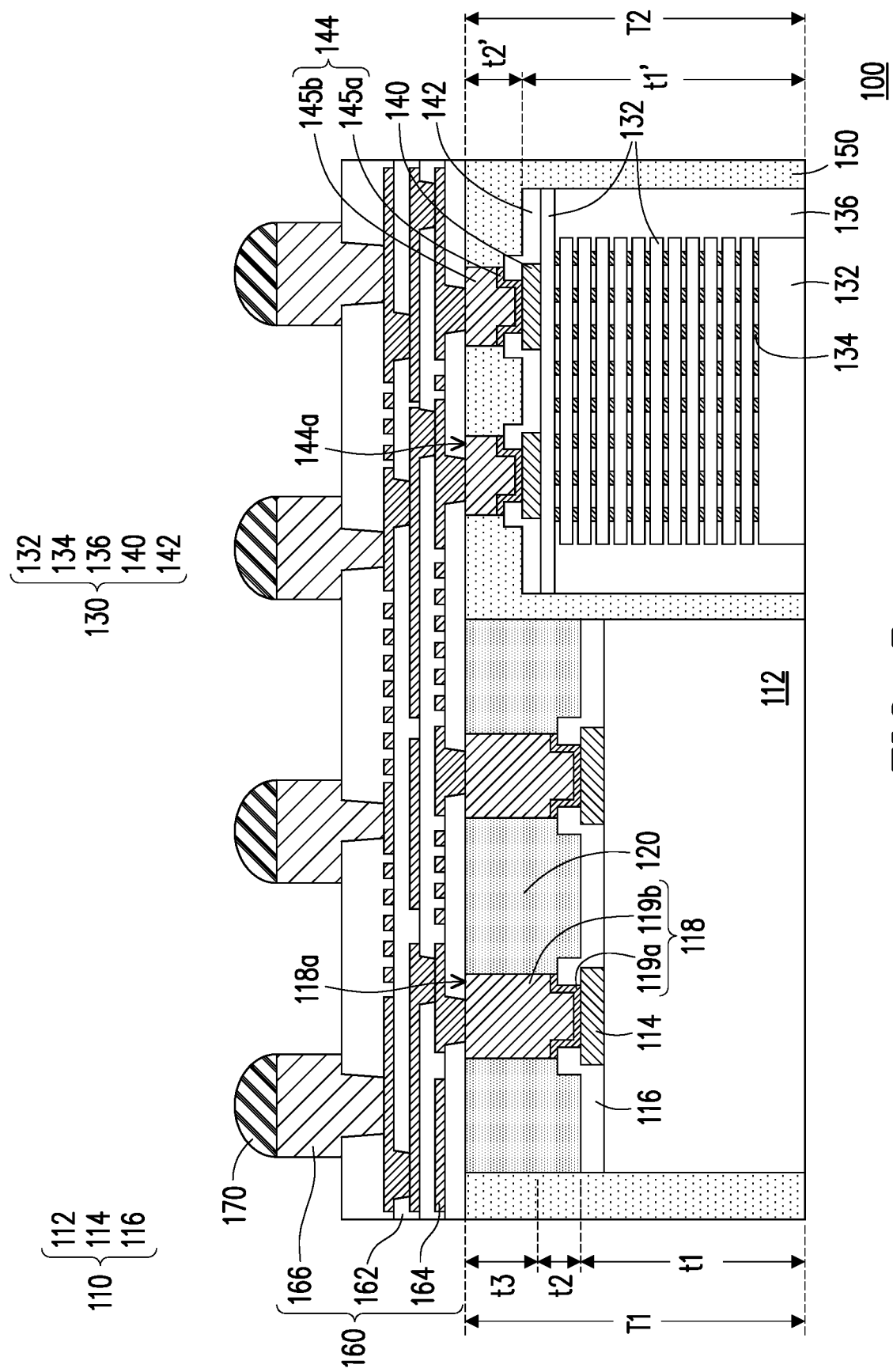
FIG. 3 is a schematic cross-sectional view of a semiconductor device according to some embodiments.

In the above embodiments, to obtain a desired thickness, the first integrated circuit 110 has multiple passivation layers and multiple conductive vias stacking thereon. However, the disclosure is not limited thereto. In some alternative embodiments, the first integrated circuit 110 has only one passivation layer thereon. For example, as shown in FIG. 3, the first conductive via 118 having a desired thickness t2 is directly formed on the first integrated circuit 110, and the first passivation layer 120 is formed aside the first conductive via 118. In such embodiments, no other conductive via is stacking on the first conductive via 118 and no other passivation layer is stacking on the first passivation layer 120. In other words, by forming the first conductive via 118 and thus the first passivation layer 120 with a desired thickness, a total thickness T1 of the first integrated circuit 110 (i.e., the thickness t1) and the first conductive via 118 (i.e., the thickness t2) thereon is substantially equal to a total thickness T2 of the second integrated circuit 130 (i.e., the thickness t1') and the conductive via 144 (i.e., the thickness t2') thereon. In some embodiments, a top surface 118a of the first conductive via 118 of the first integrated circuit 110 is substantially coplanar with a top surface 144a of the conductive via 144 of the second integrated circuit 130.

Figure 4A:
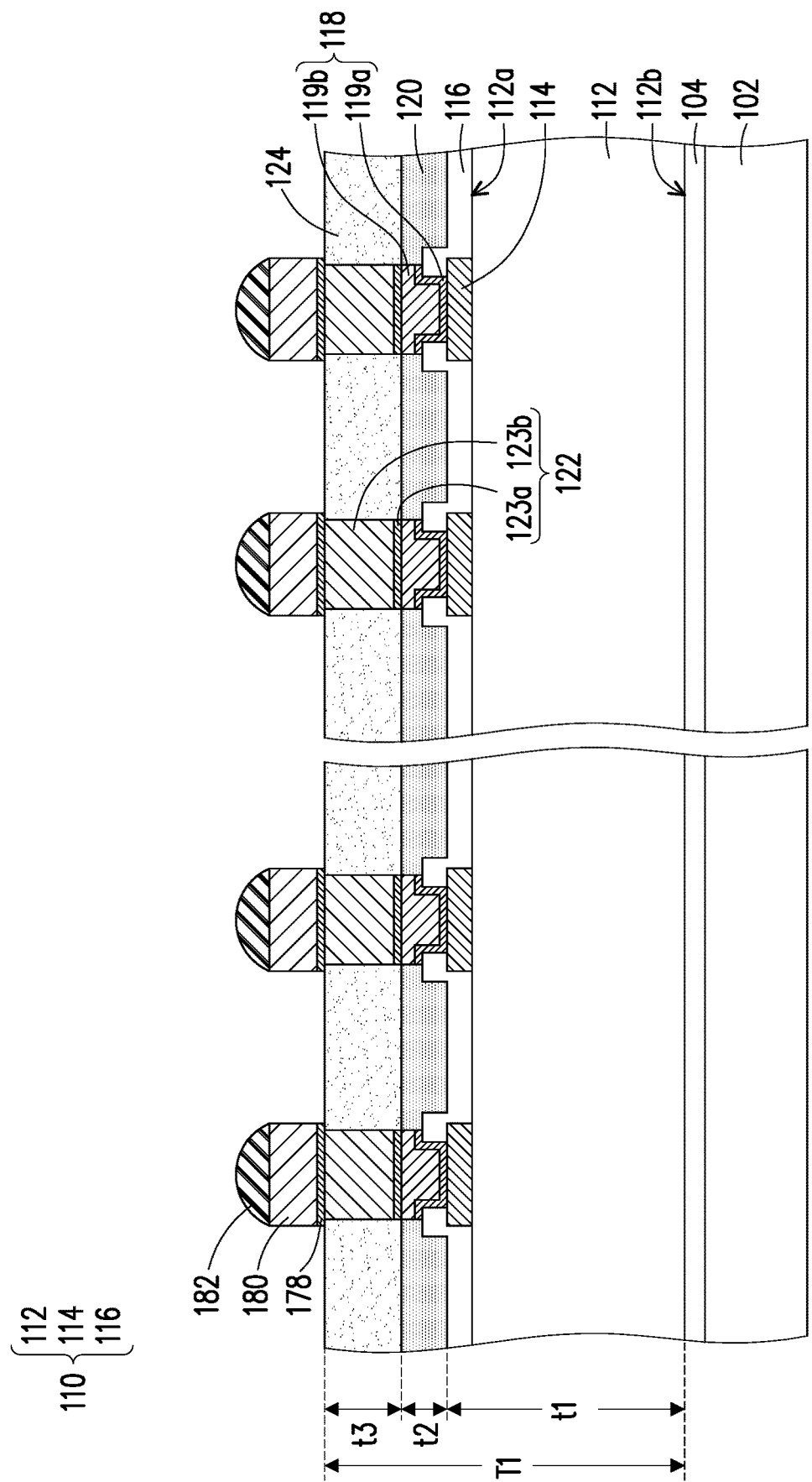
FIG. 4A to FIG. 4D are schematic cross-sectional views of various stages in a method of manufacturing a semiconductor device according to some embodiments.

In above embodiments, the semiconductor package 100 is of an integrated fan-out (InFO) package. However, the disclosure is not limited thereto. FIG. 4A to FIG. 4D are schematic cross-sectional views of various stages in a method of manufacturing a semiconductor device according to some embodiments. The steps of FIG. 4A to FIG. 4D follow the procedures of FIG. 1A to FIG. 1D, in other words, the step of FIG. 4A is continuously performed after the step of FIG. 1D. The elements similar to or substantially the same as the elements described previously will use the same reference numbers, and certain details or descriptions of the same elements may not be repeated herein. Referring to FIG. 4A, after forming the second conductive vias 122 and the second passivation layer 124, a plurality of conductive patterns 180 and a plurality of bumps 182 are formed on the second conductive vias 122 of the first integrated circuits 110. In some embodiments, the conductive patterns 180 is formed on a seed layer 178. In some embodiments, the conductive patterns 180 have a sandwich structure of copper layer, a nickel layer and a copper layer. The bumps 182 may be micro-bumps. However, the disclosure is not limited thereto. The conductive patterns 180 and the bumps 182 may have any other suitable material and/or structures.

Figure 4B:
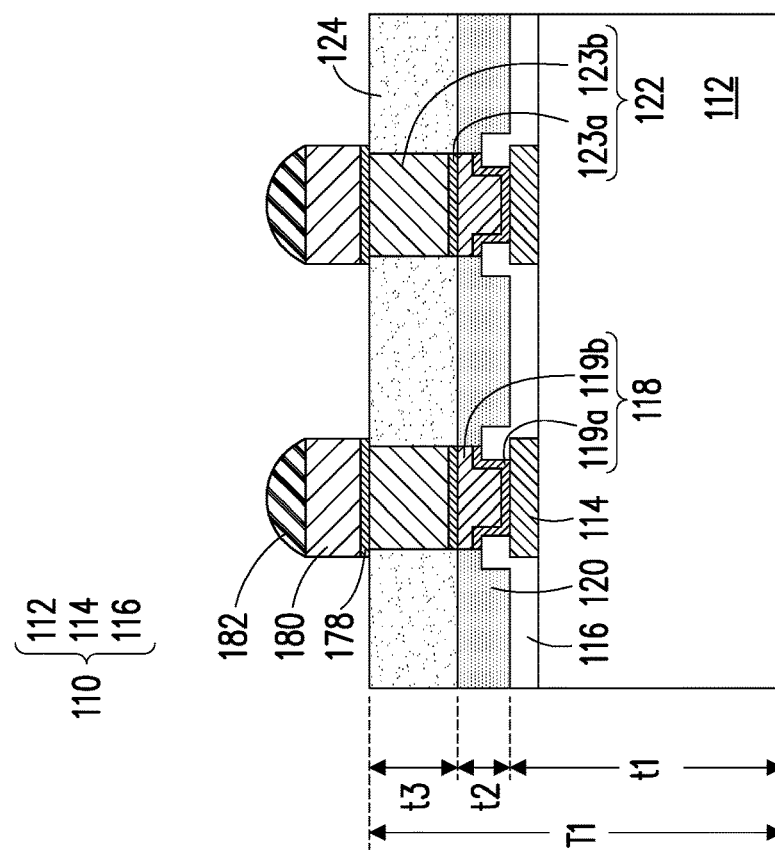

Referring to FIG. 4B, a dicing or singulation process is performed on the structure of FIG. 4A to separate the first integrated circuits 110 from each other. The step of FIG. 4B may be similar to the step of FIG. 1E, and thus the details thereof are omitted.

Figure 4C:
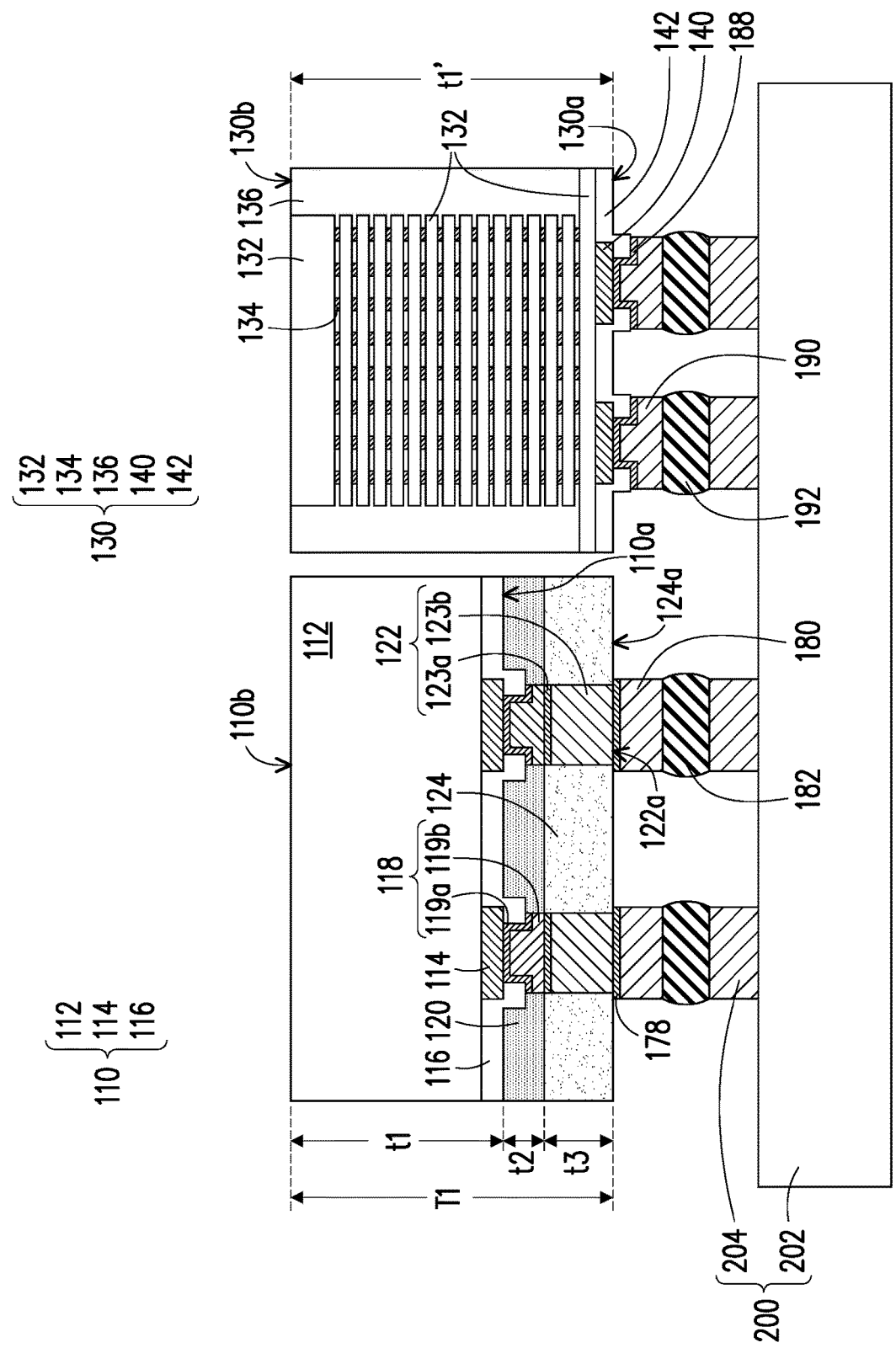

Referring to FIG. 4C, at least one first integrated circuit 110 and at least one second integrated circuit 130 are bonded onto an interposer 200. In some embodiments, the second integrated circuit 130 is similar to the second integrated circuit 130 of FIG. 1F, and the main difference lies in the second integrated circuit 130 includes a plurality of conductive patterns 190 and a plurality of bumps 192 on the second conductive pads 140. In some embodiments, the conductive pattern 190 is directly formed on a seed layer 188, and the seed layer 188 is directly formed on the second conductive pad 140. However, the disclosure is not limited thereto. In some embodiments, the first integrated circuit 110 has opposite surfaces 110a, 110b. The surface 110a is a front surface, and the surface 110b is a backside surface, for example. In some embodiments, the first conductive vias 118, the second conductive vias 122, the conductive patterns 180 and the bumps 182 are disposed at the surface 110a, and the surface 110b is exposed. In some embodiments, the surface 110b of the first integrated circuit 110 is also a surface of the first semiconductor substrate 112. In some embodiments, the second integrated circuit 130 has opposite surfaces 130a, 130b. The surface 130a is a front surface, and the surface 130b is a backside surface, for example. In some embodiments, the seed layer 188, the conductive patterns 190 and the bumps 192 are disposed at the surface 130a, and the surface 130b is exposed. In some embodiments, the surface 130b of the second integrated circuit 130 is also a surface of a semiconductor substrate (not shown) of the die 132. Materials of the seed layer 188 may include Ta, Ti, Cu, Ni, or other suitable choice of materials. In some embodiments, the conductive patterns 190 have a sandwich structure of copper layer, a nickel layer and a copper layer. The bumps 192 may be micro-bumps. However, the disclosure is not limited thereto. The conductive patterns 190 and the bumps 192 may have any other suitable material and/or structures. In some embodiments, the interposer 200 includes a substrate 202, a plurality of conductive patterns 204 on a first surface of the substrate 202 and an interconnection structure (not shown) in the substrate 202 to electrically connect the conductive patterns 204. In some embodiments, a plurality of bumps (not shown) are formed on the conductive patterns 204.

As mentioned before, the first integrated circuit 110 and the second integrated circuit 130 have different thickness t1, t1', and a thickness difference is formed between the first integrated circuit 110 and the second integrated circuit 130. However, in some embodiments, a total thickness T1 of the first integrated circuit 110 (i.e., the thickness t1) and the first conductive via 118 (i.e., the thickness t2) and the second conductive via 122 (i.e., the thickness t3) thereon is substantially equal to the thickness t1' of the second integrated circuit 130. Since a total thickness of the conductive patterns 180 and the bumps 182 of the first integrated circuit 110 may be substantially the same as a total thickness of the conductive patterns 190 and the bumps 192 of the second integrated circuit 130, after bonding to the interposer 200, the surface 110b of the first integrated circuit 110 is substantially coplanar with the surface 130b of the second integrated circuit 130. The coplanarity between the first integrated circuit 110 and the second integrated circuit 130 is beneficial to the sequential process to perform. It is noted that in some embodiments, only two conductive vias (i.e., the first conductive via 118 and the second conductive via 122) are illustrated as stacking over the first integrated circuit 110, however, in order to obtained a desired thickness, more than two conductive vias may be stacked over the first integrated circuit 110. In addition, if required, more than one conductive via may be stacked over the second integrated circuit 130.

Figure 4D:
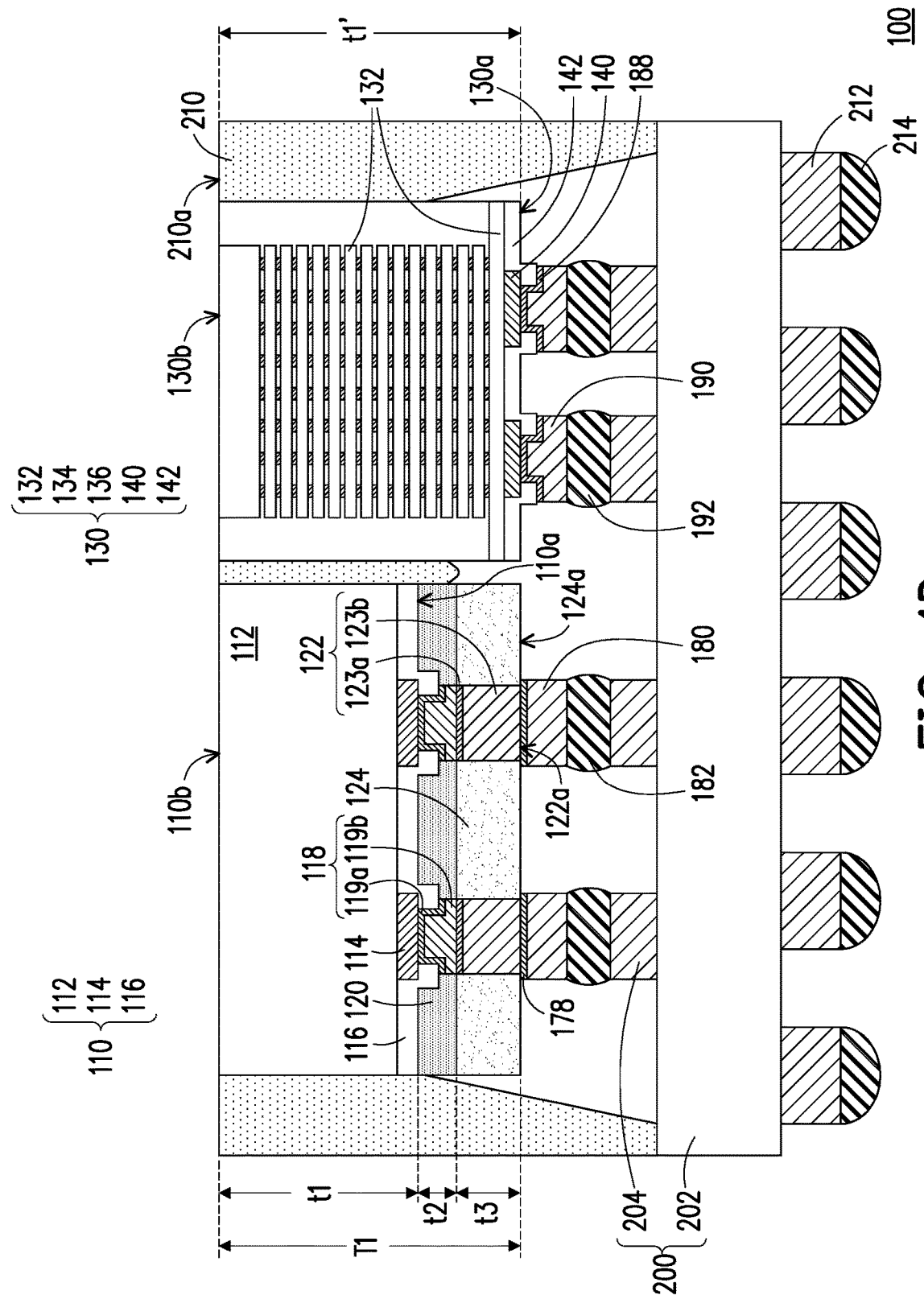

Referring to FIG. 4D, an underfill 208 is formed between the first integrated circuit 110, the second integrated circuit 130 and the interposer 200. The underfill 208 may fill gaps between the first integrated circuit 110 and the interposer 200 and gaps between the second integrated circuit 130 and the interposer 200. In some embodiments, the underfill 208 encapsulates the conductive patterns 180, 190, 204 and the bumps 182, 192 of the first integrated circuit 110, the second integrated circuit 130 and the interposer 200. In some embodiments, the underfill 208 is continuously formed aside the first integrated circuit 110 and the second integrated circuit 130. However, the disclosure is not limited thereto. In some alternative embodiments, an underfill between the first integrated circuit 110 and the interposer 200 is separated from an underfill between the second integrated circuit 130 and the interposer 200.

Then, an encapsulant 210 is formed to encapsulant the first integrated circuit 110, the second integrated circuit 130 and the underfill 208, to form a semiconductor package 100, for example. In some embodiments, a surface 210a of the encapsulant 210 is substantially coplanar with the surface 110b of the first integrated circuit 110 and the surface 130b of the second integrated circuit 130. The surface 110b of the first integrated circuit 110 and the surface 130b of the second integrated circuit 130 are exposed by the encapsulant 210. Thus, the heat generated in the first integrated circuit 110 and the second integrated circuit 130 may be dissipated from the surfaces 110b, 130b. After that, a plurality of conductive patterns 212 and a plurality of bumps 214 are formed on a second surface opposite to the first surface of the substrate 202 of the interposer 200. The conductive patterns 212 may be electrically connect the first integrated circuit 110 and the second integrated circuit 130 through the interconnection structure and the conductive patterns 204. In such embodiments, the semiconductor package 100 is a chip on wafer (CoW) structure. In some embodiments, the CoW structure further joints with a substrate in a flip-chip manner to form a chip on wafer on substrate (CoWoS) structure.

In some embodiments, the first integrated circuit (i.e., the first integrated circuit 110) has multiple passivation layers (e.g., the first passivation layer 120 and the second passivation layer 124) thereon, and thus a total thickness of the first integrated circuit and the passivation layers is designed. For example, by controlling a thickness of the topmost passivation layer (e.g., the second passivation layer 124), the total thickness of the first integrated circuit and the passivation layers (also the total thickness of the first integrated circuit and the conductive vias layers) is substantially equal to a total thickness the second integrated circuit and the conductive via thereon. Accordingly, when the first integrated circuit is integrated with the second integrated circuit (e.g., the ultra-thick integrated circuit and/or the integrated circuit from a third party manufacturer) onto a substrate such as an interposer, the backside surfaces of the first integrated circuit and the second integrated circuit are simultaneously exposed by the encapsulant. Thus, the formed semiconductor package may have a good heat dissipation, and the performance may be improved.

In some alternative embodiments (not shown), the first integrated circuit 110 and the first conductive via 118 of FIG. 4D have a structure similar to the first integrated circuit 110 and the first conductive via 118 shown in FIG. 3. In other words, no other conductive via is formed between the first conductive via 118 and the conductive pattern 180. For example, the first conductive via 118 having a desired thickness is directly formed at the surface 110a of the first integrated circuit 110, and the first passivation layer 120 is formed aside the first conductive via 118. In such embodiments, by forming the first conductive via 118 and thus the first passivation layer 120 with a desired thickness, a total thickness of the first integrated circuit 110 and the first conductive via 118 is substantially equal to a thickness of the second integrated circuit 130.

In some embodiments, by forming at least one conductive via/passivation layer with a desired thickness over the first integrated circuit, the thickness difference between the first integrated circuit and the second integrated circuit is compensated. Thus, when the first integrated circuit is integrated with the second integrated circuit, the problems due to the thickness difference such as poor coplanarity and poor heat dissipation may be prevented.

In accordance with some embodiments of the disclosure, a semiconductor package includes a first integrated circuit, a first conductive via, a second conductive via, a second integrated circuit, a third conductive via and an encapsulant. The first conductive via is disposed in a first passivation layer over the first integrated circuit. The second conductive via is disposed in a second passivation layer over the first passivation layer. The second conductive via is electrically connected to the first conductive via. The third conductive via is disposed over the second integrated circuit, wherein a surface of the third conductive via is substantially coplanar with a surface of the third conductive via. The encapsulant encapsulates the first integrated circuit, the first passivation layer, the second passivation layer, the second integrated circuit and the third conductive via.

In accordance with some embodiments of the disclosure, a semiconductor package includes an interposer, a first integrated circuit, a first conductive via, a second conductive via, a first conductive pattern, a second integrated circuit and a second conductive pattern. Thea first conductive via is disposed at a first surface of the first integrated circuit. The second conductive via is electrically connected to and disposed between the first conductive via and the first conductive pattern, and the first integrated circuit is bonded to the interposer through the first conductive pattern. The second integrated circuit has a different thickness from the first integrated circuit. The second conductive pattern is disposed at a second surface of the second integrated circuit. The second integrated circuit is bonded to the interposer through the second conductive pattern. A third surface opposite to the first surface of the first integrated circuit is substantially coplanar with a fourth surface opposite to the second surface of the second integrated circuit.

In accordance with some embodiments of the disclosure, a method of manufacturing a semiconductor package includes the following steps. A semiconductor wafer including a plurality of first integrated circuits is provided. A plurality of first conductive vias and a first passivation layer are formed over the semiconductor wafer, wherein the first conductive vias are disposed in the first passivation layer and electrically connected to the first integrated circuits. A plurality of second conductive vias and a second passivation layer are formed over the first passivation layer, wherein the second conductive vias are disposed in the second passivation layer and electrically connected to the first conductive vias. The first passivation layer, the second passivation layer and the semiconductor wafer are diced, to separate the first integrated circuits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first integrated circuit, a first conductive via in a first passivation layer over the first integrated circuit and a second conductive via in a second passivation layer over the first passivation layer, wherein the second conductive via is electrically connected to the first conductive via, wherein a dielectric layer is disposed between the first integrated circuit and the first passivation layer and surrounds a portion of the first conductive via, and the first passivation layer and the dielectric layer are two separate layers;
   a second integrated circuit and a third conductive via over the second integrated circuit, wherein the first conductive via and the second conductive via are two separate elements, a bottom surface of the third conductive via is higher than a bottom surface of the second conductive via, and a top surface of the second conductive via is substantially coplanar with a top surface of the third conductive via; and
   an encapsulant encapsulating the first integrated circuit, the first passivation layer, sidewalls of the second passivation layer, the second integrated circuit and the third conductive via, wherein a topmost surface of the first conductive via is in contact with the second conductive via, and the topmost surface of the first conductive via is substantially coplanar with a topmost surface of the first passivation layer.

2. The semiconductor package according to claim 1, wherein a top surface of the second passivation layer is substantially coplanar with the top surface of the second conductive via and the top surface of the third conductive via.

3. The semiconductor package according to claim 1, wherein sidewalls of the first passivation layer are substantially flush with the sidewalls of the second passivation layer.

4. The semiconductor package according to claim 1, wherein sidewalls of the first conductive via are substantially flush with sidewalls of the second conductive via.

5. The semiconductor package according to claim 1, wherein a top surface of the encapsulant is substantially coplanar with a top surface of the second passivation layer, the top surface of the second conductive via and top the surface of the third conductive via.

6. The semiconductor package according to claim 1, wherein the encapsulant is in direct contact with the third conductive via.

7. The semiconductor package according to claim 1, wherein a material of the second passivation layer is different from a material of the encapsulant and a material of the first passivation layer.

8. The semiconductor package according to claim 1, wherein a total thickness of the first integrated circuit, the first conductive via and the second conductive via is substantially the same as a total thickness of the second integrated circuit and the third conductive via.

9. The semiconductor package according to claim 1, wherein an average particle size of fillers in the second passivation layer is smaller than an average particle size of fillers in the encapsulant.

10. A semiconductor package, comprising:
a first integrated circuit, a conductive pad, a first conductive pillar on the conductive pad, a second conductive pillar on the first conductive pillar and a first seed layer between the first conductive pillar and the second conductive pillar, wherein a height to width ratio of the first conductive pillar is larger than a height to width ratio of the first seed layer, and a sidewall of the first conductive pillar is substantially vertical, wherein the first conductive pillar is disposed between the conductive pad and the second conductive pillar;
a first passivation layer enclosing the first conductive pillar, wherein the first conductive pillar is embedded in the first passivation layer; and
a second passivation layer enclosing the first seed layer and the second conductive pillar, wherein the first passivation layer and the second passivation layer are two separate layers, the second passivation layer has a bottom surface facing the first passivation layer and a top surface opposite to the bottom surface of the second passivation layer, the second conductive pillar has a bottom surface facing the first conductive pillar and a top surface opposite to the bottom surface of the second conductive pillar, and the top surface of the second passivation layer is substantially coplanar with the top surface of the second conductive pillar, wherein a second seed layer is disposed between the conductive pad and the first conductive pillar, and the second seed layer and the conductive pad are two separate elements.

11. The semiconductor package according to claim 10, wherein the first conductive pillar has a top surface facing the second conductive pillar, and an entire topmost surface of the first passivation layer faces the second passivation layer and is substantially coplanar with the top surface of the first conductive pillar.

12. The semiconductor package according to claim 11, wherein the entire top surface of the first passivation layer is flat.

13. The semiconductor package according to claim 10, wherein the first conductive pillar is a single element.

14. The semiconductor package according to claim 1, wherein the second passivation layer has a bottom surface facing the first passivation layer and a top surface opposite to the bottom surface of the second passivation layer, and a top surface of the encapsulant is substantially coplanar with the top surface of the second passivation layer.

15. A semiconductor package, comprising:
a first integrated circuit, a conductive pad, a first conductive via in a first passivation layer over the conductive pad and a second conductive via in a second passivation layer over the first passivation layer, wherein the second conductive via is electrically connected to the first conductive via, wherein the first conductive via is disposed between the conductive pad and the second conductive via, and the conductive pad and the first conductive via are two separate elements;
a second integrated circuit and a third conductive via over the second integrated circuit, wherein a surface of the second conductive via is substantially coplanar with a surface of the third conductive via; and
an encapsulant encapsulating the first integrated circuit, the first integrated circuit, the first passivation layer, the second passivation layer, the second integrated circuit and the third conductive via, wherein the second passivation layer has a bottom surface facing the first passivation layer and a top surface opposite to the bottom surface, and a top surface of the encapsulant is substantially coplanar with the top surface of the second passivation layer, wherein the first conductive via has a top surface facing the second conductive via, and a topmost surface of the first passivation layer faces the second passivation layer and is substantially coplanar with the top surface of the first conductive via.

16. The semiconductor package according to claim 15, wherein the conductive pad is disposed in a dielectric layer, and the dielectric layer surrounds a sidewall of the conductive pad and covers a portion of a top surface of the conductive pad.

17. The semiconductor package according to claim 15, wherein the bottom surface of the second passivation layer is in direct contact with the first passivation layer.

18. The semiconductor package according to claim 10, wherein the second seed layer and the first conductive pillar are disposed in a dielectric layer on the first integrated circuit, and the dielectric layer surrounds a sidewall of the conductive pad and covers a portion of a top surface of the conductive pad.

19. The semiconductor package according to claim 10, wherein the first passivation layer surrounds the entire first conductive pillar.

20. The semiconductor package according to claim 15, wherein the first integrated circuit is a single die and the second integrated circuit comprises a stack of dies, and a total thickness of the first integrated circuit, the first conductive via and the second conductive via is substantially the same as a total thickness of the second integrated circuit and the third conductive via.

* * * * *